(12) United States Patent
Cheng et al.

(10) Patent No.: US 10,062,868 B2
(45) Date of Patent: Aug. 28, 2018

(54) PIXEL STRUCTURE AND MANUFACTURING METHOD THEREOF

(71) Applicant: BOE TECHNOLOGY GROUP CO., LTD., Beijing (CN)

(72) Inventors: Jun Cheng, Beijing (CN); Haijing Chen, Beijing (CN); Dongfang Wang, Beijing (CN); Xiangyong Kong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 56 days.

(21) Appl. No.: 14/342,133

(22) PCT Filed: Apr. 26, 2013

(86) PCT No.: PCT/CN2013/074795
§ 371 (c)(1),
(2) Date: Feb. 28, 2014

(87) PCT Pub. No.: WO2014/121561
PCT Pub. Date: Aug. 14, 2014

(65) Prior Publication Data
US 2015/0236303 A1  Aug. 20, 2015

(30) Foreign Application Priority Data

Feb. 6, 2013 (CN) .......................... 2013 1 0047326

(51) Int. Cl.
*H01L 51/52* (2006.01)
*H01L 27/32* (2006.01)
*H01L 51/56* (2006.01)

(52) U.S. Cl.
CPC ........ *H01L 51/5275* (2013.01); *H01L 27/322* (2013.01); *H01L 27/3248* (2013.01);
(Continued)

(58) Field of Classification Search
CPC ........... H01L 51/5275; H01L 27/14627; H01L 51/5262; H01L 33/58; G02F 1/133526; G02F 2001/13356; G02F 2001/133565
See application file for complete search history.

(56) References Cited

U.S. PATENT DOCUMENTS 7,816,192 B2 * 10/2010 Kim ................. G02F 1/133553
257/59
2004/0027680 A1 * 2/2004 Ozawa ................ G02B 3/0012
359/642
(Continued)

FOREIGN PATENT DOCUMENTS

CN        1967898 A        5/2007
CN       102376743 A       3/2012
(Continued)

OTHER PUBLICATIONS

First Chinese Office Action Appln. No. 201310047326.5; dated Jan. 15, 2015.
(Continued)

*Primary Examiner* — David Spalla
(74) *Attorney, Agent, or Firm* — Ladas & Parry LLP (57) ABSTRACT

Embodiments of the present invention relate to a pixel structure and a manufacturing method thereof. The pixel structure includes: a substrate; an organic light emitting layer, disposed on the substrate; and an organic light gathering layer, disposed on a light exiting side of the organic light emitting layer, wherein light emitted from the organic light emitting layer is incident on the organic light gathering layer which is configured to gather the light emitted from the organic light emitting layer.

18 Claims, 2 Drawing Sheets

(52) U.S. Cl.
CPC ...... *H01L 27/3258* (2013.01); *H01L 51/5206* (2013.01); *H01L 51/5221* (2013.01); *H01L 51/56* (2013.01); *H01L 27/3246* (2013.01); *H01L 51/5262* (2013.01); *H01L 2227/323* (2013.01)

(56) References Cited

U.S. PATENT DOCUMENTS

| | | | |
|---|---|---|---|
| 2005/0274969 A1* | 12/2005 | Suzuki | G02F 1/133526 257/98 |
| 2007/0090350 A1* | 4/2007 | Lee | H01L 27/322 257/40 |
| 2009/0152635 A1* | 6/2009 | Jeong | H01L 27/1214 257/368 |
| 2009/0302744 A1 | 12/2009 | Kim et al. | |
| 2010/0059754 A1* | 3/2010 | Lee | H01L 27/322 257/59 |
| 2012/0038265 A1* | 2/2012 | Moriyama | H01L 51/5275 313/504 |
| 2012/0133575 A1 | 5/2012 | Hasegawa | |
| 2014/0027724 A1* | 1/2014 | Lim | H01L 51/5281 257/40 |
| 2014/0284572 A1* | 9/2014 | Oooka | H01L 51/525 257/40 |

FOREIGN PATENT DOCUMENTS

| | | |
|---|---|---|
| CN | 102479799 A | 5/2012 |
| CN | 203055914 U | 7/2013 |

OTHER PUBLICATIONS

International Preliminary Report on Patentability Appln. No. PCT/CN2013/074795; dated Aug. 11, 2015.

\* cited by examiner

PIXEL STRUCTURE AND MANUFACTURING METHOD THEREOF

TECHNICAL FIELD

Embodiments of the present invention relate to a pixel structure and a manufacturing method thereof.

BACKGROUND

An organic light emitting display is a new kind of display device. Compared with a liquid crystal display, the organic light emitting display has advantages of self-luminescence, fast response speed and wide viewing angle and can realize flexible display, transparent display and 3D display, hence gaining the rapid development and popularization. There are many ways for the organic light emitting display to display colors, such as RGB (red green blue) full color OLED (organic light emitting diode) mode, WOLED-CF (white OLED and red, green, blue and white color filters) mode and WOLED-COA (white OLED and color filter array) mode. Among them, the WOLED-COA mode display has features of good color effect, simple process and low production cost since the color filter is directly formed on a substrate, hence which is widely used.

When the organic light emitting display displays the color by means of the WOLED-COA mode, for each pixel structure contained in the organic light emitting display, the pixel structure includes an OLED layer and a color filter layer, wherein the OLED layer is configured to generate white light and the color filter layer is configured to convert the white light generated by the OLED layer into color light. Since the white light from the OLED layer is emitted along all directions, the color light converted in the color filter layer from the white light emitted from the OLED layer has the small intensity, resulting in the low display brightness of the organic light emitting display.

SUMMARY

Embodiments of the present invention provide a pixel structure and a manufacturing method thereof which can enhance the display brightness of an organic light emitting display.

A pixel structure according to an embodiment of the present invention includes: a substrate; an organic light emitting layer, disposed on the substrate; and an organic light gathering layer, disposed on a light exiting side of the organic light emitting layer, wherein light emitted from the organic light emitting layer is incident on the organic light gathering layer which is configured to gather the light emitted from the organic light emitting layer.

A method for manufacturing a pixel structure according to an embodiment of the present invention includes: forming the organic light gathering layer the substrate and forming the organic light emitting layer on the organic light gathering layer; or forming the organic light emitting layer on the substrate and forming the organic light gathering layer on the organic light emitting layer.

The pixel structure provided in the embodiment of the present invention includes a substrate and an organic light emitting layer disposed on the substrate, and further includes an organic light gathering layer for gathering light generated by the organic light emitting layer. Since the organic light gathering layer can gather light from the organic light emitting layer to enhance the intensity of light transmitting through the organic light gathering layer, thereby the display brightness of the organic light emitting display is enhanced.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A pixel structure provided in embodiments of the present invention includes a substrate and an organic light emitting layer disposed on the substrate, and further includes an organic light gathering layer for gathering light generated by the organic light emitting layer. Since the organic light gathering layer can condense light from the organic light emitting layer, thus, the intensity of light emitted from the organic light gathering layer can be improved, thereby improving the display brightness of the organic light emitting display.

It is to be noted that one pixel structure in the embodiments of the present invention refers to one pixel unit.

The embodiments of the present invention will be further described in detail below with reference to accompanying drawings.

The pixel structure provided in the embodiments of the present invention includes a substrate and an organic light emitting layer disposed on the substrate, and further includes an organic light gathering layer for gathering light generated by the organic light emitting layer. Alternatively, the material for the organic light gathering layer is transparent organic material with a light transmittance greater than a specific threshold. Furthermore, the specific threshold may be set as required, for example, set to 95%.

Alternatively, the organic light gathering layer is a transparent organic film, such as, a transparent organic film formed of acrylic resin (for example, $(C_3H_4O_2)_n$) or derivatives of the acrylic resin.

Alternatively, according to the location relationship between the organic light gathering layer and the organic light emitting layer, embodiments of the present invention provide two different kinds of pixel structure, namely a first pixel structure and a second pixel structure which will be explained respectively below.

A First Pixel Structure

An organic light gathering layer is disposed between a color filter layer and an organic light emitting layer, namely, on a light incident side of the color filter layer.

Figure 1:
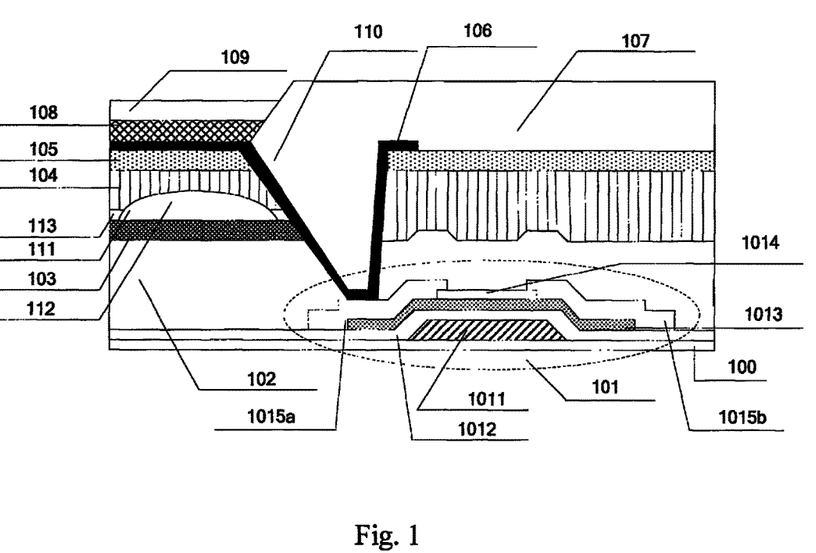
FIG. 1 is a cross-sectional structural view of a first pixel structure according to an embodiment of the present invention.

As shown in FIG. 1, the first pixel structure provided in the embodiments of the present invention includes: a substrate 100; a thin film transistor 101, disposed on the substrate 100; a first passivation layer 102, disposed on the substrate 100 and partially covering the thin film transistor 101; a color filter layer 103, disposed on the first passivation layer 102; a planarization layer 104, disposed on the color filter layer 103; a second passivation layer 105, disposed on the planarization layer 104; a transparent electrode layer 106, disposed on the second passivation layer 105 and electrically connected with the thin film transistor 101; the pixel defining layer 107, disposed on the transparent electrode layer 106; an OLED layer (i.e, an organic light emitting layer) 108, disposed on the pixel defining layer 107; and a cathode metal layer 109, disposed on the organic light emitting layer 108.

Herein, the thin film transistor 101 includes: a gate electrode layer 1011, disposed on the substrate 100; a gate insulating layer 1012, disposed on the substrate 100 and covering the gate electrode layer 1011; a semiconductor active layer 1013, disposed on the gate insulating layer 1012; an etch stop layer 1014, disposed on the semiconductor active layer 1013; and a drain electrode 1015a and a source electrode 1015b, disposed on both sides of the semiconductor active layer 1013.

Alternatively, the transparent electrode layer 106 is electrically connected with the thin film transistor 101. Exemplarily, the transparent electrode layer 106 is electrically connected with the drain electrode 1015a of the thin film transistor 101 via a first contact hole 110, wherein the first contact hole 110 penetrates the second passivation layer 105, the planarization layer 104, the color filter layer 103 and the first passivation layer 102 and reaches the drain electrode 1015a of the thin film transistor 101.

Alternatively, the first pixel structure provided in the embodiment of the present invention further includes an organic light gathering layer 111 disposed between the color filter layer 103 and the organic light emitting layer 108 and for gathering light generated by the organic light emitting layer 108 and transmitting the gathered light to the color filter layer 103.

In a specific example, since the cathode metal layer 109 has non-light-transmission property, the pixel defining layer 107, the transparent electrode layer 106, the second passivation layer 105 and the planarization layer 104 has light transmission property, thus light generated by the organic light emitting layer 108 is transmitted towards the substrate 100 (towards a bottom), gathered by the organic light gathering layer 111 disposed between the organic light emitting layer 108 and the color filter layer 103 and then emitted towards the color filter layer 103. The organic light gathering layer 111 gathers divergent light emitted by the organic light emitting layer 108 along in various directions, thus forming color light with large intensity and density, realizing the high brightness display of the organic light emitting display.

Alternatively, the organic light gathering layer 111 includes at least one first lens unit 112.

Alternatively, the organic light gathering layer 111 includes 1~10 first lens units 112.

Figure 3A:
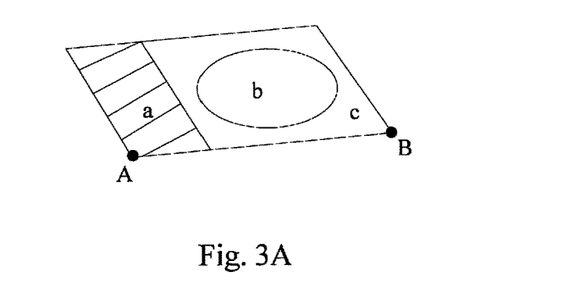
FIGS. 3A-3D are projection views of an organic light gathering layer on a substrate according to the embodiment of the present invention.
Figure 3B:
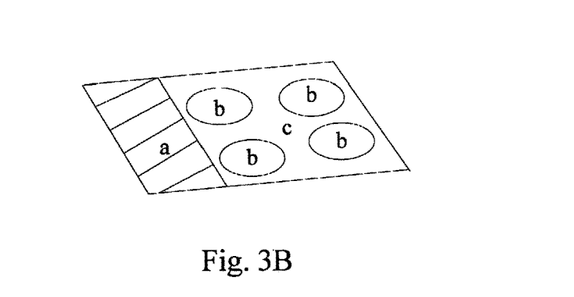

Exemplarily, FIG. 3A shows a projection view on the substrate 100 of the first pixel structure in which the organic light gathering layer 111 includes one first lens unit 112,
FIG. 3B shows a projection view on the substrate 100 of the first pixel structure in which the organic light gathering layer 111 includes four first lens unit 112, wherein a region a in FIGS. 3A and 3B is a projection region of the thin film transistor 101 on the substrate 100, and a region b in FIGS. 3A and 3B is the projection region of the first lens unit 112 included in the organic light gathering layer 111 on the substrate 100.

Alternatively, the first lens unit 112 is a convex lens.

In a specific example, since the light generated by the organic light emitting layer 108 travels towards the substrate 100 (to the bottom), the first lens unit 112 is a convex lens and the organic light gathering layer 111 is convex towards a light entering direction, the organic light gathering layer 111 can gather divergent light traveling along various directions emitted by the organic light emitting layer 108, and the light is refracted at an interface between the organic light gathering layer 111 and a layer adjacent to the organic light gathering layer 111 at a light incident side of the organic light gathering layer.

Alternatively, the first lens unit 112 is of an arc cross-sectional shape in a plane direction perpendicular to the substrate 100, that is, the first lens unit 112 is of an arc shape at an interface with an adjacent layer at its light incident side.

Alternatively, a cross section of the first lens unit 112 in a plane direction parallel to the substrate 100 may be formed as required, for example, formed into a circle shape, a ellipse shape or a rectangle shape.

Figure 3C:
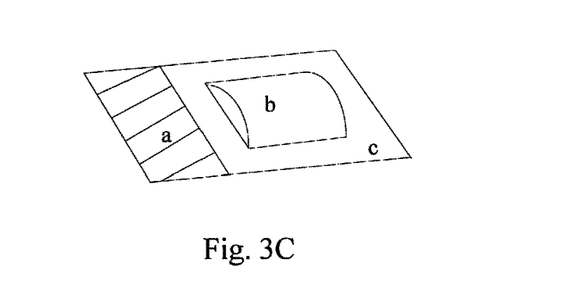
Figure 3D:
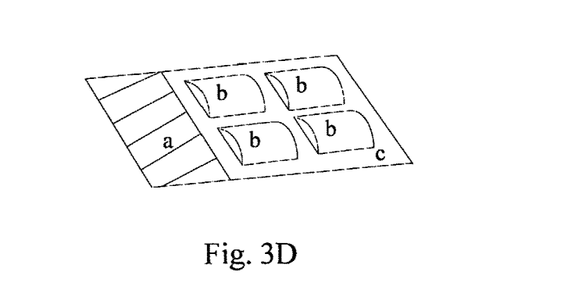

When the first lens unit 112 is of a circular cross-sectional shape in the plane direction parallel to the substrate 100, the projection of the first pixel structure including the first lens unit 112 on the substrate 100 is shown in FIGS. 3A and 3B; when the first lens unit 112 is of a rectangular cross-sectional shape in the plane direction parallel to the substrate 100, the projection of the first pixel structure including the first lens unit 112 on the substrate 100 is shown in FIGS. 3C and 3D.

Alternatively, in a case that the first lens unit 112 is of circular and ellipse cross-sectional shapes in the plane direction parallel to the substrate 100, a long radius of the cross section of the first lens unit 112 in the plane direction parallel to the substrate 100 is parallel or perpendicular to a long side of the pixel structure; in a case that the first lens unit 112 is of a rectangular cross-sectional shape in the plane direction parallel to the substrate 100, a long side of the cross section of the first lens unit 112 in the plane direction parallel to the substrate 100 is parallel or perpendicular to the long side of the pixel structure, wherein the long side of the pixel structure refers to a longest side of the pixel structure or the pixel unit, and as shown in FIG. 3A, a side AB is the long side of the pixel structure.

As shown in FIG. 3A, when the first lens unit 112 is of a circular cross-sectional shape in the plane direction parallel to the substrate 100, the long radius of the circle is parallel to the long side of the pixel structure; as shown in FIG. 3C, when the first lens unit 112 is of a rectangular cross-sectional shape in the plane direction parallel to the substrate 100, the long side of the rectangle is parallel to the long side of the pixel structure.

In a specific example, the organic light gathering layer 111 including the first lens unit 112 has a better light gathering effect.

In a specific example, a thickness of the organic light gathering layer 111 may be set as required, such as set to 0.2 µm-5 µm. Alternatively, the thickness of the organic light gathering layer 111 is 1 µm-2 µm.

Alternatively, a layer on a light incident side of the organic light gathering layer 111 and adjacent to the organic light gathering layer 111 is formed from material different from that of the organic light gathering layer 111.

Alternatively, the layer on the light incident side of the organic light gathering layer 111 and adjacent to the organic light gathering layer 111 has a refractive index smaller than that of the organic light gathering layer 111.

In a specific example, the smaller the refractive index of the layer on the light incident side of the organic light gathering layer 111 and adjacent to the organic light gathering layer 111 is as compared with that of the organic light gathering layer 111, the greater the convergence degree of light refracted at the interface between the organic light gathering layer 111 and the adjacent layer on its light incident side is, and hence the stronger the light gathering ability of the organic light gathering layer 111 for gathering light emitted from the organic light emitting layer 108 is.

Alternatively, the organic light gathering layer 111 may be disposed at a plurality of locations, such as, between the color filter layer 103 and the planarization layer 104, between the planarization layer 104 and the second passivation layer 105, or between the second passivation layer 105 and the transparent electrode layer 106, as long as the organic light gathering layer 111 can gather the light emitted from the organic light emitting layer 108 and direct the gathered light to the color filter layer 103.

Alternatively, there may be one or a plurality of organic light gathering layers 111 in the embodiments of the present invention and the location of each of the organic light gathering layers 111 is not limited in the embodiments of the present invention.

Alternatively, the first pixel structure further includes a free transmission layer 113 for transmitting light from the organic light emitting layer 108 towards various directions and disposed on the light incident side of the color filter layer 103, and a projection region of the free transmission layer 113 on the substrate 100 will not overlap with a projection region of the organic light gathering layer 111 on the substrate 100.

The region c in FIGS. 3A, 3B, 3C and 3D is the projection region of the free transmission layer 113 on the substrate 100.

In a specific example, when the organic light gathering layer 111 gathers light emitted from the organic light emitting layer 108 to enhance the display brightness of the display device, since there exist the free transmission layer 113 that can transmit light of the organic light emitting layer 108 towards the various directions, thus, guaranteeing the viewing angle of the display device.

Exemplarily, the organic light gathering layer 111 will be described in detail taking the following case as an example in which the organic light gathering layer 111 is disposed between the color filter layer 103 and the planarization layer 104 and the organic light gathering layer 111 comprises one first lens unit 112, implementations for other cases are similar to that of the embodiments of the present invention and will not be described in detail herein.

As shown in FIG. 1, the organic light gathering layer 111 is disposed between the color filter layer 103 and the planarization layer 104 and includes one first lens unit 112 wherein an interface of the first lens unit 112 on the light incident side of the first lens unit 112 has an arc cross-sectional shape in the plane direction perpendicular to the substrate 100. In addition, material for the planarization layer 104 and material for the organic light gathering layer 111 are different, the refractive index of the planarization layer 104 is smaller than the refractive index of the organic light gathering layer 111, and the planarization layer 104 and the organic light gathering layer 111 are both transparent organic films.

The transparent electrode layer 106 electrically connected with the drain electrode 1015a of the thin film transistor 101 provides anode electrical signal for the organic light emitting layer 108 and the cathode metal layer 109 with the non-light-transmission property provides cathode signal for the organic light emitting layer 108.

The white light generated by the organic light emitting layer 108 is incident on the organic light gathering layer 111 and the free transmission layer 113 after transmitted through the pixel defining layer 107, the transparent electrode layer 106, the second passivation layer 105 and the planarization layer 104 with the light transmission property.

The organic light gathering layer 111 gathers the received white light generated by the organic light emitting layer 108 and the free transmission layer 113 transmits the received white light generated by the organic light emitting layer 108 towards various directions.

The white light transmitted by the organic light gathering layer 111 and the free transmission layer 113 becomes color light after passing the color filter layer 103 and being filtered.

Alternatively, the gate electrode layer 1011 is a single-layer or multi-layer composite film formed of one or more of Mo (molybdenum), MoNb (molybdenum niobium alloy), Al (aluminum), AlNd (aluminum neodymium alloy), Ti (titanium) and Cu (copper).

Alternatively, a thickness of the gate electrode layer 1011 is 100 nm~3000 nm.

Alternatively, the gate insulating layer 1012 is a single layer or multi-layer composite film formed of one or more of SiOx (silicon oxide), SiNx (silicon nitride), HfOx (hafnium oxide), SiON (silicon nitride oxide) and AlOx (aluminum oxide).

Alternatively, the H (hydrogen) content of the gate insulating layer 1012 is lower than a specific threshold. Furthermore, the specific threshold may be set to 10%.

It is to be noted that the H content in the gate insulating layer of the thin film transistor of the pixel structure may also be a value known in the art.

Alternatively, a thickness of the gate insulating layer 1012 is 1500~3000 Å. Alternatively, the semiconductor active layer 1013 is made of a-Si (amorphous silicon), P—Si (polysilicon) or oxide semiconductor. Alternatively, the oxide semiconductor is made of a thin film containing elements such as In (indium), Ga (gallium), Zn (zinc), O (oxygen) and Sn (tin), herein the thin film must contain oxygen element and two or more other elements such as IGZO (indium gallium zinc oxide), IZO (indium zinc oxide), InSnO (indium tin oxide), InGaSnO (indium gallium tin oxide).

Alternatively, a thickness of the semiconductor active layer 1013 is 10 nm~100 nm.

Alternatively, the etch stop layer 1014 is a single-layer or multi-layer composite film formed of one or more of SiOx, SiNx, HfOx and AlOx.

Alternatively, the H (hydrogen) content in the etch stop layer 1014 is lower than a specific threshold. Furthermore, the specific threshold may be set to 8%.

It is to be noted that the H content in the etch stop layer of the thin film transistor in the pixel structure of the embodiments of the present invention may also be a common value known in the art.

Alternatively, a thickness of the etch stop layer 1014 is 800 Å~2000 Å.

Alternatively, the drain electrode 1015a and the source electrode 1015b are single-layer or multi-layer composite films formed of one or more of Mo, MoNb, Al, AlNd, Ti and Cu.

Alternatively, the first passivation layer 102 is a single-layer or multi-layer composite film formed of one or more of SiOx, SiNx, HfOx and AlOx.

Alternatively, the first passivation layer 102 is a double-layer composite film formed of SiOx and SiNx. Alternatively, a thickness of SiOx is 2000 Å~3000 Å, and a thickness of SiNx is 200 Å~1000 Å.

Alternatively, the H content of the first passivation layer 102 is below a specific threshold. Furthermore, the specific threshold may be set to 10%.

It is to be noted that the H content in the passivation layer of the pixel structure of the embodiments of the present invention may also be a common value known in the art.

Alternatively, the first passivation layer 102 has high compactness and good surface characteristic.

In a specific example, the planarization layer 104 has a thickness of 0.2 μm~5 μm. Alternatively, the thickness of the planarization layer 104 is 1 μm~2 μm.

Alternatively, the second passivation layer 105 is similar to the first passivation layer 102 except that it is required that the H content in the first passivation layer 102 is lower than that of the second passivation layer 105 and the compactness of the first passivation layer 102 is higher than that of the second passivation layer 105 in order to ensure that the thin film transistor 101 protected by the first passivation layer 102 has good performance.

A Second Pixel Structure

Herein, an organic light gathering layer is disposed on a light exiting side of an organic light emitting layer and a color filter layer, and an organic protection layer is disposed on a light exiting side of the organic light gathering layer.

Figure 2:
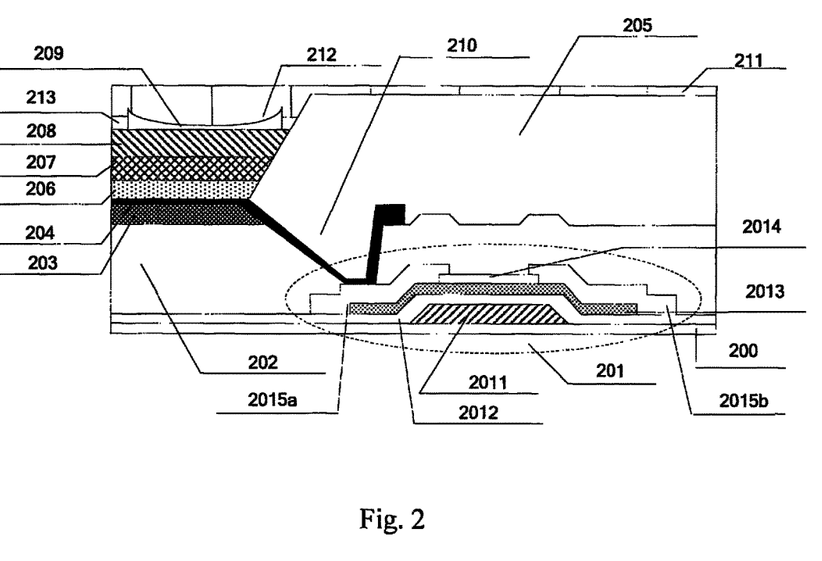
FIG. 2 is a cross-sectional structural view of a second pixel structure according to an embodiment of the present invention.

As shown in FIG. 2, the second pixel structure provided in the embodiment of the present invention includes: a substrate 200; a thin film transistor 201, disposed on the substrate 200; a passivation layer 202, disposed on the substrate 200 and partially covering the thin film transistor 201; a reflection electrode layer 203, disposed on the passivation layer 202 (that is, the reflection electrode layer 203 is disposed on a side of the organic light emitting layer opposite to a side on which the organic light gathering layer is disposed); a transparent electrode layer 204, disposed on the reflection electrode layer 203 and electrically connected with the thin film transistor 201; a pixel defining layer 205, disposed on the transparent electrode layer 204; an OLED layer (the organic light emitting layer) 206, disposed on the pixel defining layer 205; a cathode metal layer 207, disposed on the organic light emitting layer 206; a color filter layer 208, disposed on the cathode metal layer 207; and an organic light gathering layer 209, disposed on the color filter layer 208.

Herein, the thin film transistor 201 includes: a gate electrode layer 2011, disposed on the substrate 200; a gate insulating layer 2012, disposed on the substrate 200 and covering the gate electrode layer 2011; a semiconductor active layer 2013, disposed on the gate insulating layer 2012; an etch stop layer 2014, disposed on the semiconductor active layer 2013; and a drain electrode 2015a and a source electrode 2015b, disposed on both sides of the semiconductor active layer 2013, respectively.

Alternatively, the transparent electrode layer 204 is electrically connected with the thin film transistor 201, wherein the transparent electrode layer 204 is electrically connected with the drain electrode 2015a of the thin film transistor 201 via a second contact hole 210, and the second contact hole 210 penetrates the reflection electrode layer 203 and the passivation layer 202 and reaches the drain electrode 2015a of the thin film transistor 201.

In a specific example, the transparent electrode layer 204 electrically connected with the drain electrode 2015a of the thin film transistor 201 provides anode electrical signal for the organic light emitting layer 206 and the cathode metal layer 207 with the light transmission property provides cathode electrical signal for the organic light emitting layer 206.

A part of white light generated by the organic light emitting layer 206 is incident on the reflection electrode layer 203 after passing the pixel defining layer 205 and the transparent electrode layer 204 with the light transmission property, the reflection electrode layer 203 reflects the received white light. The white light reflected by the reflection electrode layer 203 passes the transparent electrode layer 204, the pixel defining layer 205, the organic light emitting layer 206, the cathode metal layer 207, the color filter layer 208 and the organic light gathering layer 209 in this order. Another part of the white light generated by the organic light emitting layer 206 passes the cathode metal layer 207, the color filter layer 208 and the organic light gathering layer 209 in this order.

The color filter layer 208 converts the received white light into color light and the organic light gathering layer 209 gathers the received color light.

In a specific example, the gate electrode layer 2011, the gate insulating layer 2012, the semiconductor active layer 2013, the etch stop layer 2014, the drain electrode 2015a, the source electrode 2015b and the passivation layer 202 in the second pixel structure are similar to the gate electrode layer 1011, the gate insulating layer 1012, the semiconductor active layer 1013, the etch stop layer 1014, the drain electrode 1015a, the source electrode 1015b and the passivation layer 102 in the first pixel structure, respectively, and will not be described in detail here.

Alternatively, the reflection electrode layer 203 is formed of material with strong reflection effect, such as Ag (silver).

Alternatively, the second pixel structure provided in the embodiment of the present invention further includes an organic protection layer 211, disposed over the organic light gathering layer 209 and for protecting the second pixel structure from erosion by air and moisture.

Alternatively, the organic protection layer 211 is a transparent organic film with a light transmittance greater than a set threshold. Furthermore, the set threshold may be set as required to e.g., 95%.

It is to be noted that the organic protection layer of the pixel structure in the embodiments of the present invention may also be a common organic protection layer in the art.

In a specific example, a thickness of the organic protection layer 211 is 0.2 μm~5 μm. Alternatively, a thickness of the organic protection layer 211 is 1 μm~2 μm.

In a specific example, a thickness of the organic light gathering layer 209 may be set as required, such as, set to 0.2 μm-5 μm. Alternatively, the thickness of the organic light gathering layer 209 is 1 μm-2 μm.

Alternatively, the organic light gathering layer 209 includes at least one second lens unit 212.

Alternatively, the organic light gathering layer 209 includes 1~10 second lens units 212.

Alternatively, the second lens unit 212 is a concave lens.

In a specific example, since the light generated by the organic light emitting layer 206 travels towards the cathode metal layer 207 (towards the top), the second lens unit 212 is a concave lens and the organic light gathering layer 209 is concave towards a light entering side, the organic light gathering layer 209 can gather divergent light traveling along various directions emitted by the organic light emitting layer 206. It is noted that, since the organic light gathering layer 209 is concave towards the light entering side, the light refracts at an interface between the organic light gathering layer 209 and the organic protection layer 211 and is focused.

Alternatively, the second lens unit 212 is of an arc cross-sectional shape in a plane direction perpendicular to the substrate 200, that is, the second lens unit 212 is of the arc cross-sectional shape at the interface between it and the organic protection layer 211 (adjacent layer on its light exiting side).

Alternatively, the second lens unit 212 is of a circular, ellipse or rectangular cross-sectional shape in a plane direction parallel to the substrate 200.

In a specific example, the organic light gathering layer 209 including the second lens unit 212 has a better light gathering effect.

Alternatively, the organic light gathering layer 209 and the organic protection layer 211 are formed of different materials, respectively. Alternatively, the organic protection layer 211 has a light refractive index greater than that of the organic light gathering layer 209.

In a specific example, the larger the light refractive index of the organic protection layer 211 is as compared with that of the organic light gathering layer 209, the greater the convergence degree of light refracted at the interface between the organic light gathering layer 209 and the organic protection layer 211, hence the stronger the light gathering ability of the organic light gathering layer 209 for gathering light emitted from the organic light emitting layer 206 is.

Alternatively, the second pixel structure further comprises a free transmission layer 213 configured to transmit light from the organic light emitting layer 206 towards various directions, wherein a projection region of the free transmission layer 213 on the substrate 200 will not overlap with a projection region of the organic light gathering layer 209 on the substrate 200.

In a specific example, the organic light gathering layer 209 in the second pixel structure is similar to the organic light gathering layer 111 in the first pixel structure, and repetitions will not be described in detail.

A organic light emitting display comprising the pixel structure provided in the embodiment of the present invention has the improved display brightness, because in the pixel structure, the organic light gathering layer disposed on a light exiting side of the organic light emitting layer can gather the light emitted from the organic light emitting layer so that the intensity of light exiting from the organic light gathering layer can be enhanced.

Alternatively, the embodiments of the present invention further provide a method for manufacturing the above-mentioned pixel structure (the first pixel structure and the second pixel structure), comprising:

Preparing an organic light gathering layer on a substrate and preparing an organic light emitting layer on the organic light gathering layer; or Preparing an organic light emitting layer on a substrate and preparing an organic light gathering layer on the organic light emitting layer.

For different pixel structures, the methods for fabricating the pixel structures are different. They will be described respectively below with respect to the first pixel structure and the second pixel structure described in the embodiments.

A Method for Manufacturing the First Pixel Structure

A method for manufacturing the first pixel structure according to an embodiment of the present invention includes:

step 401, forming a thin film transistor on a substrate and preparing a first passivation layer covering the thin film transistor on the thin film transistor;

step 402, forming a color filter layer on the first passivation layer;

step 403, forming an organic light gathering layer on the color filter layer;

step 404, forming a planarization layer on the organic light gathering layer;

step 405, forming a second passivation layer on the planarization layer;

step 406, forming a first contact hole penetrating the second passivation layer, the planarization layer, the organic light gathering layer, the color filter layer and the first passivation layer and exposing a drain electrode of the thin film transistor by the lithography;

step 407, forming a transparent electrode layer connected to the drain electrode of the thin film transistor via the first contact hole on the second passivation layer;

step 408, forming a pixel defining layer on the transparent electrode layer;

step 409, forming an organic light emitting layer on the pixel defining layer.

Alternatively, in step 401, the faulting the thin film transistor on the substrate includes: forming a gate electrode layer on the substrate, forming a gate insulating layer covering the gate electrode layer on the gate electrode layer, forming a semiconductor active layer on the gate insulating layer, forming an etch stop layer on the semiconductor active layer and forming a drain electrode 1015a and a source electrode 1015b on both sides of the semiconductor active layer.

Alternatively, in step 401, the forming the first passivation layer covering the thin film transistor on the thin film transistor includes: forming the first passivation layer covering the thin film transistor on the thin film transistor by using PECVD (plasma enhanced chemical vapor deposition) technology.

Alternatively, in step 403, the forming the organic light gathering layer on the color filter layer includes: depositing an organic film layer with a light transmittance greater than a specific threshold on the color filter layer and covering the organic film layer with a mask being semi-transparent; exposing and treating the organic film layer covered by the mask to obtain the organic light gathering layer.

Alternatively, in order to manufacture the first lens unit included in the organic light gathering layer as a convex lens, a mask with a transmittance gradually decreased from an edge to a center is used as the mask covering the organic film layer, that is, the semi-transparent mask is a mask with a gradual varied light transmittance.

Alternatively, in step 405, the forming the second passivation layer on the planarization layer includes: forming the second passivation layer on the planarization layer by using PECVD technology.

Alternatively, after forming the organic light emitting layer on the pixel defining layer, the step 409 further includes: forming a cathode metal layer on the organic light emitting layer.

It is to be noted that the organic light gathering layer may be located at a plurality of locations. For example, the organic light gathering layer 111 may be located between the color filter layer 103 and the planarization layer 104, between the planarization layer 104 and the second passivation layer 105, or between the second passivation layer 105 and the transparent electrode layer 106. Implementations for the organic light gathering layers at different locations are similar to these of the embodiments of the present invention, except that the manufacturing orders of layers included in the first pixel structure are different for the organic light gathering layers at different locations.

A Method for Manufacturing the Second Pixel Structure

The method for manufacturing the second pixel structure according to an embodiment of the present invention includes:

step 501, forming a thin film transistor on a substrate and forming a passivation layer covering the thin film transistor on the thin film transistor;

step 502, forming a reflection electrode layer on the passivation layer;

step 503, forming a second contact hole penetrating the reflection electrode layer and the passivation layer and exposing a drain electrode of the thin film transistor by lithography;

step 504, forming a transparent electrode layer connected to the drain electrode of the thin film transistor via the second contact hole on the reflection electrode layer;

step 505, forming a pixel defining layer on the transparent electrode layer;

step 506, forming an organic light emitting layer on the pixel defining layer;

step 507, forming a cathode metal layer on the organic light emitting layer;

step 508, forming a color filter layer on the cathode metal layer;

step 509, forming an organic light gathering layer on the color filter layer.

In a specific example, in step 501, the method for manufacturing the thin film transistor in the second pixel structure is similar to that of the thin film transistor in the first pixel structure, which will not be described in detail.

Alternatively, in step 501, the forming the passivation layer covering the thin film transistor on the thin film transistor includes: forming the passivation layer covering the thin film transistor on the thin film transistor by using PECVD technology.

Alternatively, in step 502, the forming the reflection electrode layer on the passivation layer includes: forming the reflection electrode layer on the passivation layer by using sputter technology.

Alternatively, in step 509, the forming the organic light gathering layer on the color filter layer includes: depositing an organic film layer with a light transmittance greater than a specific threshold on the color filter layer; covering a semi-transparent mask on the organic film layer; exposing and treating the organic film layer covered by the mask to obtain the organic light gathering layer.

Alternatively, in order to manufacture the second lens unit included in the organic light gathering layer as a concave lens, a mask with a transmittance gradually increased from an edge to a center is used as the mask covering the organic film layer, that is, the semi-transparent mask is a mask with a gradual varied light transmittance.

Alternatively, after forming the organic light gathering layer on the color filter layer, the step 509 further includes: forming an organic protection layer on the organic light gathering layer.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A pixel structure, comprising:
   a substrate;
   an organic light emitting layer, disposed on the substrate;
   an organic light gathering layer, disposed on a light exiting side of the organic light emitting layer, wherein light emitted from the organic light emitting layer is incident on the organic light gathering layer which is configured to gather a first portion of the light emitted from the organic light emitting layer; and
   a free transmission layer configured to transmit a second portion of the light emitted from the organic light emitting layer towards various directions, wherein a projection region of the entire free transmission layer on the substrate and a projection region of the entire organic light gathering layer on the substrate are non-overlapped; and
   wherein the free transmission layer and the organic light gathering layer are disposed on a same layer, the entire free transmission layer being non-overlapped with the entire organic light gathering layer on the same layer;
   wherein the pixel structure further comprises a color filter layer disposed between the organic light emitting layer and the organic light gathering layer, and the organic light gathering layer is disposed on a light exiting side of the color filter layer;
   wherein the pixel structure further comprises an organic protection layer which is disposed on a light exiting side of the organic light gathering layer and has a refractive index greater than that of the organic light gathering layer; and
   wherein the pixel structure further comprises:
   a thin film transistor formed on the substrate and a passivation layer covering the thin film transistor on the thin film transistor:
   a reflection electrode layer formed on the passivation layer;
   a second contact hole penetrating the reflection electrode layer and the passivation layer and exposing a drain electrode of the thin film transistor;
   a transparent electrode layer connected to the drain electrode of the thin film transistor via the second contact hole on the reflection electrode layer;
   a pixel defining layer formed on the transparent electrode layer, wherein the organic light emitting layer is disposed on the pixel defining layer;
   a cathode metal layer formed on the organic light emitting layer, wherein the color filter layer is disposed on the cathode metal layer; and
   wherein the free transmission layer is formed directly on the pixel defining layer.

2. The pixel structure according to claim 1, wherein organic protection layer is closely adjacent to the organic light gathering layer.

3. The pixel structure according to claim 1, wherein the organic light gathering layer comprises at least one second lens unit.

4. The pixel structure according to claim 3, wherein the second lens unit is a concave lens with a cave opening of the concave lens facing towards the organic protection layer.

5. The pixel structure according to claim 4, wherein the second lens unit is of a circular, ellipse or rectangular cross-sectional shape in a plane direction parallel to the substrate, the second lens unit is of an arc cross-sectional shape in a plane direction perpendicular to the substrate.

6. The pixel structure according to claim 1, wherein material for the organic light gathering layer is transparent organic material.

7. The pixel structure according to claim 1, wherein the organic light gathering layer is a transparent organic film formed of acrylic resin or derivatives of acrylic resin.

8. The pixel structure according to claim 2, wherein the reflection electrode layer, disposed on a side of the organic light emitting layer that is opposite to a side on which the organic light gathering layer is disposed, is configured to reflect light incident on it towards the organic light gathering layer.

9. A method for manufacturing the pixel structure according to claim 1, the method comprising:
   forming the organic light emitting layer on the substrate and forming the organic light gathering layer on the organic light emitting layer.

10. The method according to claim 9, wherein the forming the organic light emitting layer on the substrate and forming the organic light gathering layer on the organic light emitting layer comprises:
   Forming the thin film transistor on the substrate and forming the passivation layer covering the thin film transistor on the thin film transistor;
   forming the reflection electrode layer on the passivation layer;
   forming the second contact hole penetrating the reflection electrode layer and the passivation layer and exposing the drain electrode of the thin film transistor by lithography;
   forming the transparent electrode layer connected to the drain electrode of the thin film transistor via the second contact hole on the reflection electrode layer;
   forming the pixel defining layer on the transparent electrode layer;
   forming the organic light emitting layer on the pixel defining layer;
   forming the cathode metal layer on the organic light emitting layer;
   forming the color filter layer on the cathode metal layer; and
   forming the organic light gathering layer on the color filter layer.

11. A pixel structure, comprising:
   a substrate;
   an organic light emitting layer, disposed on the substrate;
   an organic light gathering layer, disposed on a light exiting side of the organic light emitting layer, wherein light emitted from the organic light emitting layer is incident on the organic light gathering layer which is configured to gather a first portion of the light emitted from the organic light emitting layer; and
   a free transmission layer configured to transmit a second portion of the light emitted from the organic light emitting layer towards various directions, wherein a boundary of a projection region of the organic light gathering layer on the substrate is overlapped with a projection region of the free transmission layer on the substrate while a remaining portion of the projection region of the organic light gathering layer on the substrate is non-overlapped with the projection region of the free transmission layer on the substrate; and
   wherein the free transmission layer and the organic light gathering layer are disposed on a same layer;
   wherein the pixel structure further comprises a color filter layer, the organic light gathering layer is disposed between the organic light emitting layer and the color filter layer, and the organic light gathering layer is disposed on a light incident side of the color filter layer; and
   wherein the pixel structure further includes:
   a thin film transistor formed on the substrate and a first passivation layer covering the thin film transistor on the thin film transistor;
   a color filter layer formed on the first passivation layer, wherein the organic light gathering layer is formed on the color filter layer;
   a planarization layer formed on the organic light gathering layer;
   a second passivation layer formed on the planarization layer;
   a first contact hole penetrating the second passivation layer, the planarization layer, the organic light gathering layer, the color filter layer and the first passivation layer and exposing a drain electrode of the thin film transistor;
   a transparent electrode layer connected to the drain electrode of the thin film transistor via the first contact hole on the second passivation layer; and
   a pixel defining layer formed on the transparent electrode layer, wherein the organic light emitting layer is formed on the pixel defining layer.

12. The pixel structure according to claim 11, wherein the planarization layer is disposed between the organic light emitting layer and the organic light gathering layer and is disposed on a light incident side of the organic light gathering layer and adjacent to the organic light gathering layer.

13. The pixel structure according to claim 12, wherein a refractive index of the organic light gathering layer is greater than that of the planarization layer.

14. The pixel structure according to claim 11, wherein the organic light gathering layer comprises at least one first lens unit.

15. The pixel structure according to claim 14, wherein the first lens unit is a convex lens with a convex surface facing towards the organic light emitting layer.

16. A method for manufacturing the pixel structure according to claim 11, the method comprising:
   forming the organic light gathering layer on the substrate,
   forming the free transmission layer on the substrate, and forming the organic light emitting layer on the organic light gathering layer.

17. The method according to claim 16, wherein the forming the organic light gathering layer on the substrate and forming the organic light emitting layer on the organic light gathering layer comprises:
   forming the thin film transistor on the substrate and forming the first passivation layer covering the thin film transistor on the thin film transistor;
   forming the color filter layer on the first passivation layer;
   forming the organic light gathering layer on the color filter layer;

forming the planarization layer on the organic light gathering layer;

forming the second passivation layer on the planarization layer;

forming the first contact hole penetrating the second passivation layer, the planarization layer, the organic light gathering layer, the color filter layer and the first passivation layer and exposing the drain electrode of the thin film transistor by lithography;

forming the transparent electrode layer connected to the drain electrode of the thin film transistor via the first contact hole on the second passivation layer;

forming the pixel defining layer on the transparent electrode layer; and forming the organic light emitting layer on the pixel defining layer.

18. The method according to claim 17, wherein the forming the organic light gathering layer comprises: forming a transparent organic film layer on the color filter layer; covering a mask with gradually varied light transmittance on the organic film layer; and exposing and treating the organic film layer covered by the mask to obtain the organic light gathering layer.

* * * * *